(12) United States Patent
Hsu et al.

(10) Patent No.: US 11,309,028 B2
(45) Date of Patent: Apr. 19, 2022

(54) INFERENCE OPERATION METHOD AND CONTROLLING CIRCUIT OF 3D NAND ARTIFICIAL INTELLIGENCE ACCELERATOR

(71) Applicant: MACRONIX INTERNATIONAL CO., LTD., Hsinchu (TW)

(72) Inventors: Po-Kai Hsu, Tainan (TW); Teng-Hao Yeh, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 9 days.

(21) Appl. No.: 17/011,039

(22) Filed: Sep. 3, 2020

(65) Prior Publication Data
US 2022/0068387 A1 Mar. 3, 2022

(51) Int. Cl.
| | | |
|---|---|---|
| G11C 16/04 | (2006.01) | |
| G11C 16/08 | (2006.01) | |
| G06N 5/04 | (2006.01) | |
| G11C 16/26 | (2006.01) | |
| G06F 7/544 | (2006.01) | |
| G11C 16/24 | (2006.01) | |

(52) U.S. Cl.
CPC ........ *G11C 16/0483* (2013.01); *G06F 7/5443* (2013.01); *G06N 5/04* (2013.01); *G11C 16/08* (2013.01); *G11C 16/24* (2013.01); *G11C 16/26* (2013.01)

(58) Field of Classification Search
CPC ..... G11C 16/0483; G11C 16/08; G11C 16/24; G11C 16/26; G06F 7/5443; G06N 5/04
See application file for complete search history.

(56) References Cited

U.S. PATENT DOCUMENTS

| 10,671,349 B2* | 6/2020 | Bannon ................. G06F 15/80 |
| 2020/0193277 A1* | 6/2020 | Kwon .................... G06F 7/5443 |
| 2020/0401414 A1* | 12/2020 | Ware ....................... G06F 7/5443 |
| 2021/0294608 A1* | 9/2021 | Yudanov ............. G06F 9/30043 |

* cited by examiner

*Primary Examiner* — Ajay Ojha
(74) *Attorney, Agent, or Firm* — McClure, Qualey & Rodack, LLP

(57) ABSTRACT

An inference operation method and a controlling circuit of a 3D NAND artificial intelligence accelerator are provided. The 3D NAND artificial intelligence accelerator includes a plurality of memory cells, a plurality of bit lines, a plurality of word lines and a plurality of string selecting line groups each of which includes at least one string selecting line. The inference operation method includes the following steps: The patterns are inputted to the bit lines. The word lines are switched to switch the filters. The string selecting line groups are switched to switch the filters. In a word line pioneering scheme and a string selecting line group pioneering scheme, when the patterns inputted to each of the bit lines are switched, any one of the word lines is not switched and any one of the string selecting line groups is not switched.

18 Claims, 15 Drawing Sheets

INFERENCE OPERATION METHOD AND CONTROLLING CIRCUIT OF 3D NAND ARTIFICIAL INTELLIGENCE ACCELERATOR

BACKGROUND OF THE INVENTION

Field of the Invention

The disclosure relates in general to a 3D NAND device, and more particularly to an inference operation method and a controlling circuit of a 3D NAND artificial intelligence accelerator.

Description of the Related Art

Along with the development of the artificial intelligence (AI) technology, the artificial intelligence accelerator for edge computing has been becoming more and more vital for the integration and implementation of the AIoT applications. Aside from the conventional Von Neumann computing architecture, a potential technique, computing in-memory (CIM), draws worldwide attentions for its better performance claiming at least an order of magnitude improvement by reducing data movement. Among various candidates of CIM, 3D NAND artificial intelligence accelerator possesses highest memory density and low ON current that enables high parallelism.

During the inference operation of the 3D NAND artificial intelligence accelerator, patterns are inputted to the filters for performing Multiply-Accumulation (MAC) operation. The inference operation consumes a lot of to calculate huge amounts of data and causes huge power consumption. Therefore, the researchers are working on ways to improve the energy efficient of the inference operation of the 3D NAND artificial intelligence accelerator.

SUMMARY OF THE INVENTION

The disclosure is directed to an inference operation method and a controlling circuit of a 3D NAND artificial intelligence accelerator. The inference operation of the 3D NAND artificial intelligence accelerator is performed by sharing the pre-charged word line/string selecting line group/ground selecting line. The time and energy consumption can thus be amortized.

According to a first aspect of the present disclosure, an inference operation method of a 3D NAND artificial intelligence accelerator is provided. The 3D NAND artificial intelligence accelerator includes a plurality of memory cells, a plurality of bit lines, a plurality of word lines and a plurality of string selecting line groups each of which includes at least one string selecting line. A plurality of filters are stored in the memory cells that are selected by the word lines, the string selecting lines and the bit lines when being read. A plurality of patterns are inputted to the bit lines for performing a Multiply-Accumulation (MAC) operation. The inference operation method includes the following steps: The patterns are inputted to the bit lines. The word lines are switched to switch the filters. The string selecting line groups are switched to switch the filters. When the patterns inputted to each of the bit lines are switched, any one of the word lines is not switched and any one of the string selecting line groups is not switched.

According to a second aspect of the present disclosure, a controlling circuit of a 3D NAND artificial intelligence accelerator is provided. The 3D NAND artificial intelligence accelerator includes a plurality of memory cells, a plurality of bit lines, a plurality of word lines and a plurality of string selecting line groups each of which includes at least one string selecting line. A plurality of filters are stored in the memory cells that are selected by the word lines, the string selecting lines and the bit lines when being read. A plurality of patterns are inputted to the bit lines for performing a Multiply-Accumulation (MAC) operation. The controlling circuit includes a bit line controller and a word line and string selecting line controller. The bit line controller is configured to input the patterns to the bit lines. The word line and string selecting line controller is configured to switch the word lines to switch the filters, and is configured to switch the string selecting line groups to switch the filters. In a word line pioneering scheme and a string selecting line group pioneering scheme, when the bit line controller switches the patterns inputted to each of the bit lines, any one of the word lines is not switched and any one of the string selecting line groups is not switched.

The above and other aspects of the disclosure will become better understood with regard to the following detailed description of the preferred but non-limiting embodiment(s). The following description is made with reference to the accompanying drawings.

DETAILED DESCRIPTION OF THE INVENTION

Figure 1:
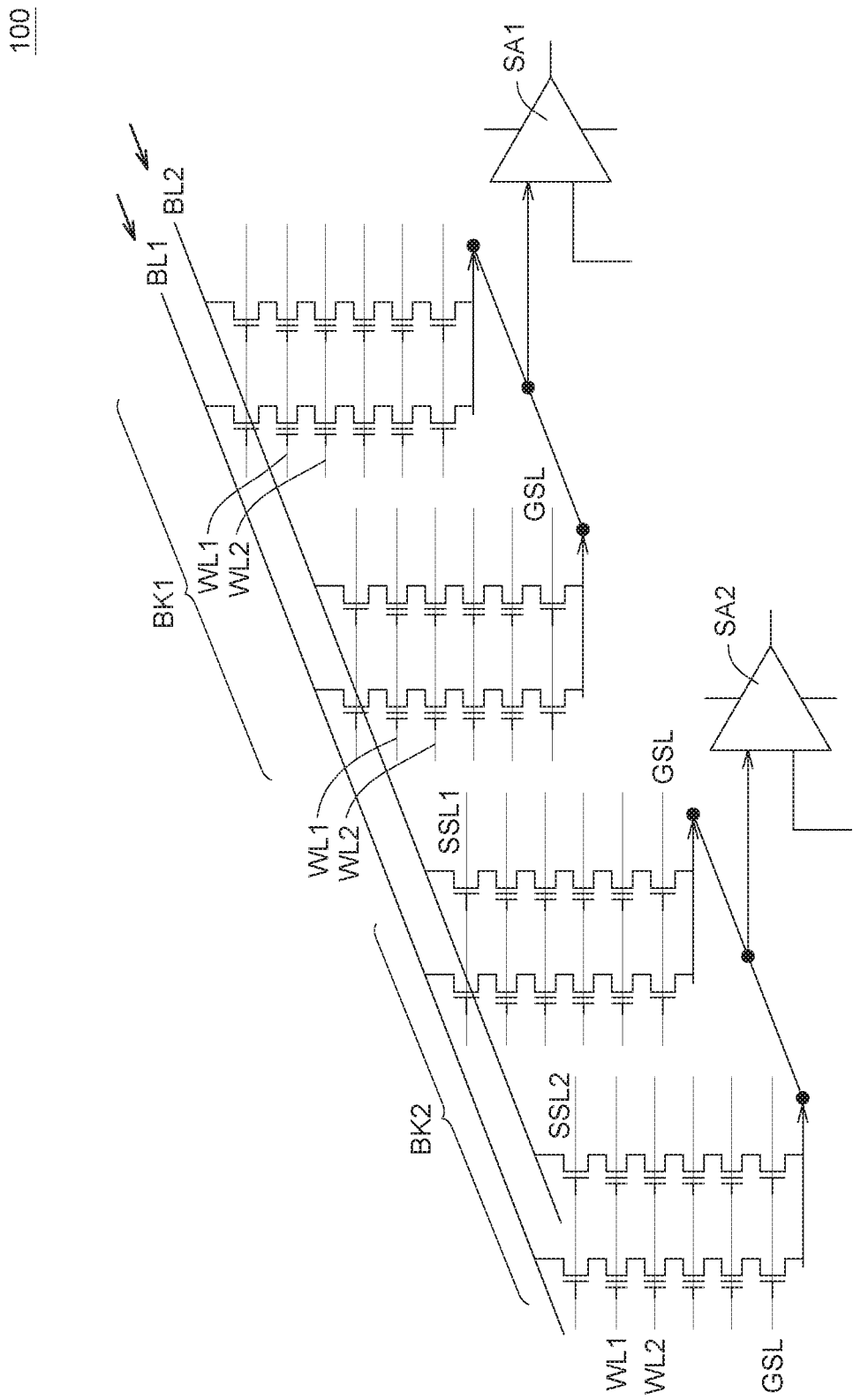
FIG. 1 shows a 3D NAND artificial intelligence accelerator according to one embodiment.

Please refer to FIG. 1, which shows a 3D NAND artificial intelligence accelerator 100 according to one embodiment. The 3D NAND artificial intelligence accelerator 100 includes a plurality of memory cells, a plurality of bit lines BL1, BL2, . . . , a plurality of word lines WL1, WL2, . . . , a plurality of string selecting lines SSL1, SSL2, . . . , a plurality of ground selecting lines GSL, and a plurality of sense amplifiers SA1, SA2, . . . . The 3D NAND artificial intelligence accelerator 100 may include a plurality of blocks BK1, BK2, . . . , BKn (shown in FIG. 2), for a plurality of kernels. A plurality of filters are stored in the memory cells that are selected by the word lines WL1, WL2, . . . , the string selecting lines SSL1, SSL2, . . . and the bit lines BL1, BL2, . . . when being read. A plurality of patterns are inputted to the bit lines BL1, BL2, . . . for performing a Multiply-Accumulation (MAC) operation. The MAC operation is a vector-matrix multiplication, and the summation current is converted to voltage by the sense amplifiers SA1, SA2, . . . for the arithmetic operation.

Figure 2:
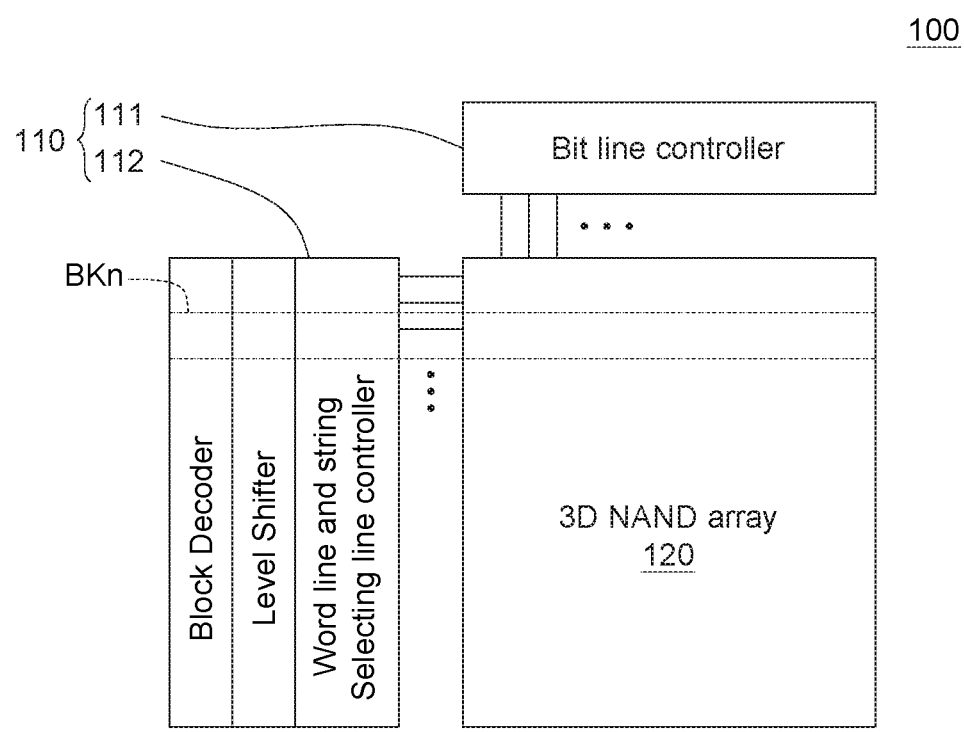
FIG. 2 shows a block diagram of the 3D NAND artificial intelligence accelerator.

Please refer to FIG. 2, which shows a block diagram of the 3D NAND artificial intelligence accelerator 100. The 3D NAND artificial intelligence accelerator 100 includes a controlling circuit 110 and a 3D NAND array 120. The controlling circuit 110 includes a bit line controller 111 and a word line and string selecting line controller 112. The bit line controller 111 is configured to input the patterns to the bit lines BL1, BL2, . . . (shown in FIG. 1). The word line and string selecting line controller 112 is configured to switch the word lines WL1, WL2, . . . (shown in FIG. 1) to switch the filters, and is configured to switch the string selecting lines SSL1, SSL2, . . . (shown in FIG. 1) to switch the filters.

Figure 3:
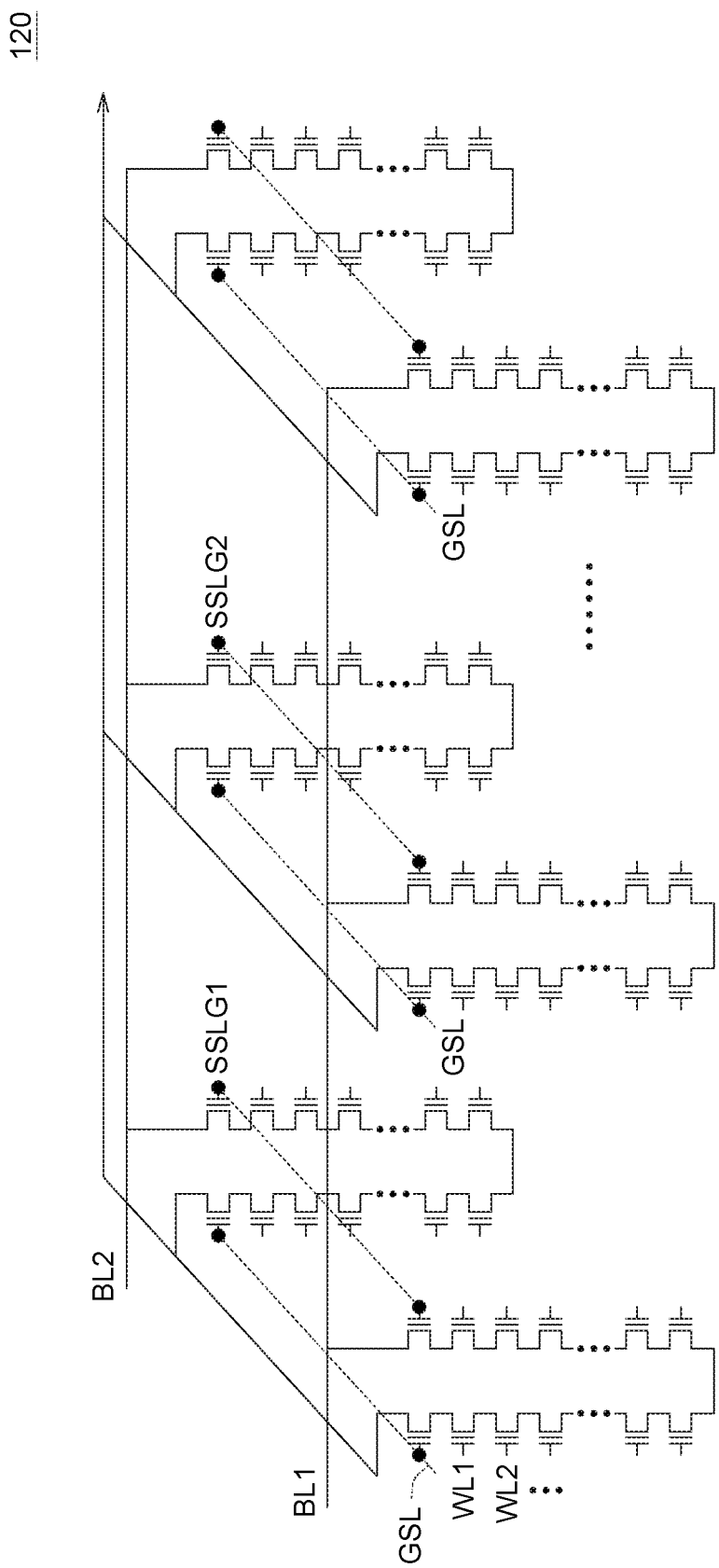
FIG. 3 shows the 3D NAND array of the 3D NAND artificial intelligence accelerator.

Please refer to FIG. 3, which shows the 3D NAND array 120 of the 3D NAND artificial intelligence accelerator 100. In one embodiment, every three or more of the string selecting lines may be grouped to form a plurality of string selecting line groups SSLG1, SSLG2, . . . , such that the number of bits can be increased. In every one of the string selecting line groups SSLG1, SSLG2, . . . , the string selecting lines are synchronously controlled by the word line and string selecting line controller 112. During the inference operation, the word line and string selecting line controller 112 switches the string selecting line groups SSLG1, SSLG2, . . . to switch the filters.

For improving the energy efficient of the inference operation, a word line pioneering scheme and a string selecting line group pioneering scheme are provided. In the word line pioneering scheme and the string selecting line group pioneering scheme, the pre-charged word line/string selecting line group/ground selecting line is reused, such that the time and energy consumption can thus be amortized.

The word line pioneering scheme is illustrated via FIGS. 4 to 8; and the string selecting line group pioneering scheme is illustrated via FIGS. 9 to 14.

Figure 4:
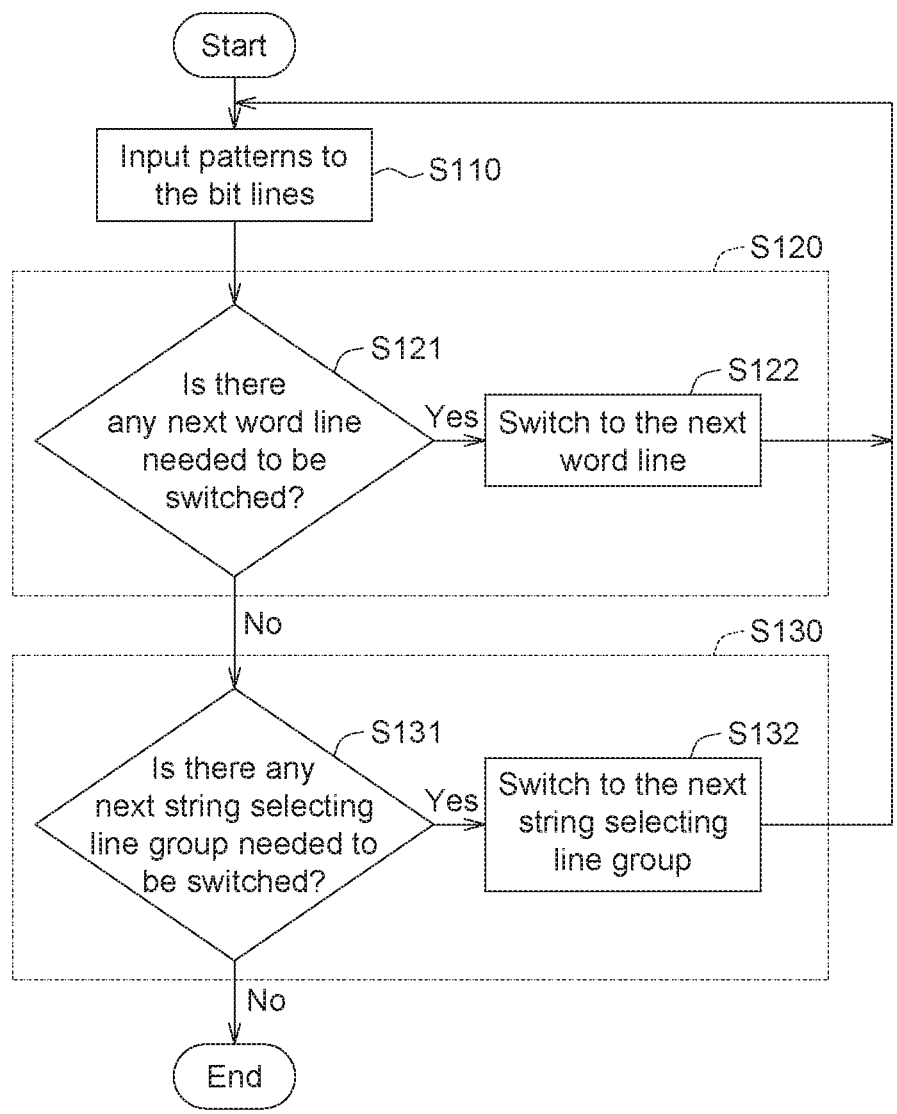
FIG. 4 shows a flowchart of the inference operation method of the 3D NAND artificial intelligence accelerator according to the word line pioneering scheme.

Please refer to FIG. 4, which shows a flowchart of the inference operation method of the 3D NAND artificial intelligence accelerator 100 according to the word line pioneering scheme. In step S110, the patterns are inputted to the bit lines BL1, BL2, . . . .

In step S120, the word lines WL1, WL2, . . . are switched to switch the filters. The step S120 includes steps S121 and S122. In step S121, whether there is any next word line needed to be switched is determined. If there is another word line needed to be switched, then the process proceeds to step S122. In step S122, the next word line is switched. Then, the step S110 is performed again for this word line.

In step S130, the string selecting line groups SSLG1, SSLG2, are switched to switch the filters. The step S130 includes steps S131 and S132. In step S131, whether there is any next string selecting line group needed to be switched is determined. If there is another string selecting line group needed to be switched, then the process proceeds to step S132. In step S132, the next string selecting line group is switched. Then, the step S110 is performed again for this string selecting line group.

That is to say, in the word line pioneering scheme, each time one of the word lines is switched, the patterns inputting loop is performed once; and each time one of the string selecting line groups is switched, the word line switching loop is performed once.

Figure 5:
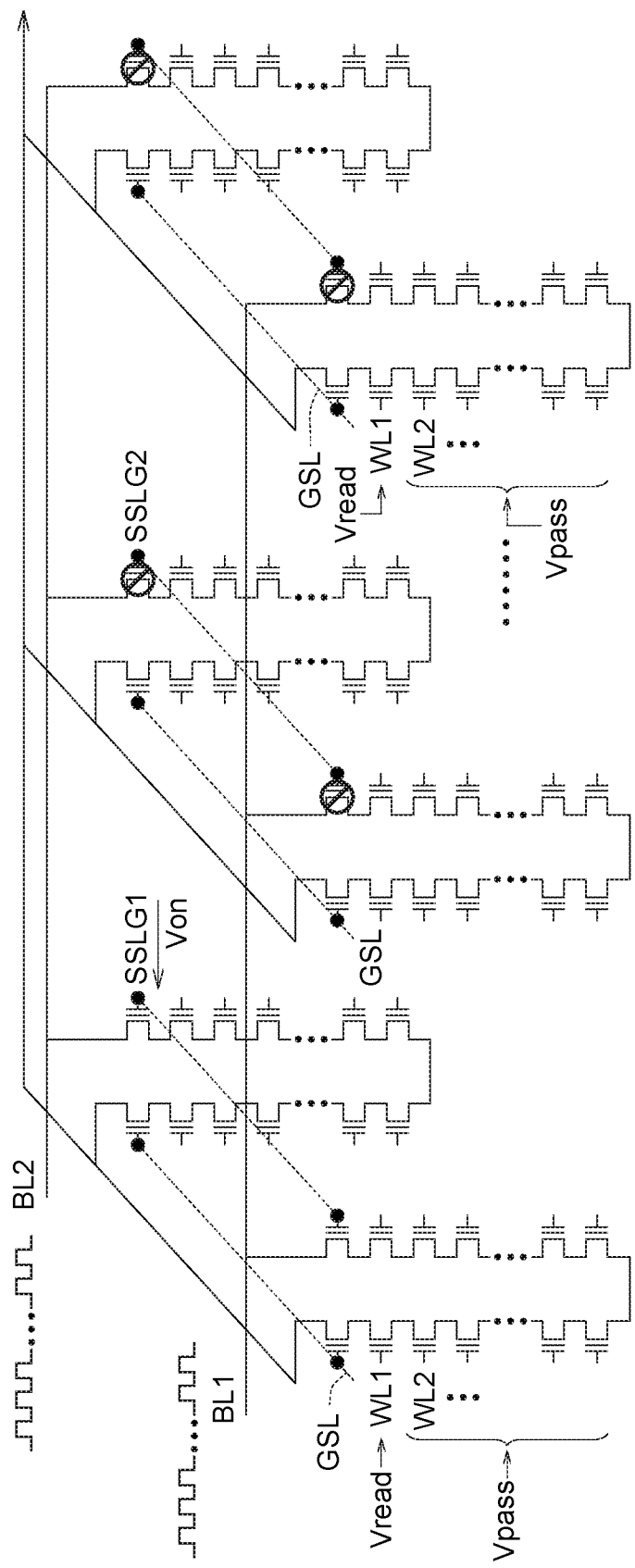
FIGS. 5 to 7 illustrate the word line pioneering scheme.
Figure 6:
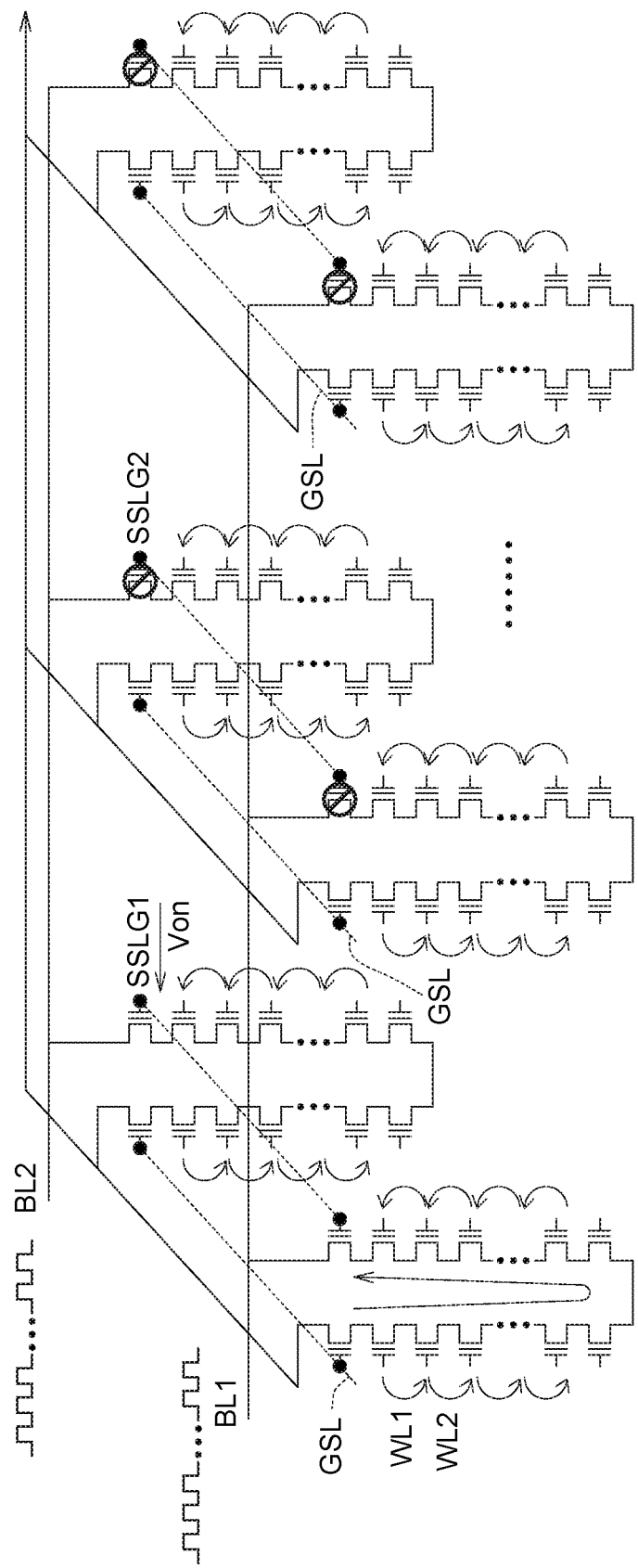
Figure 7:
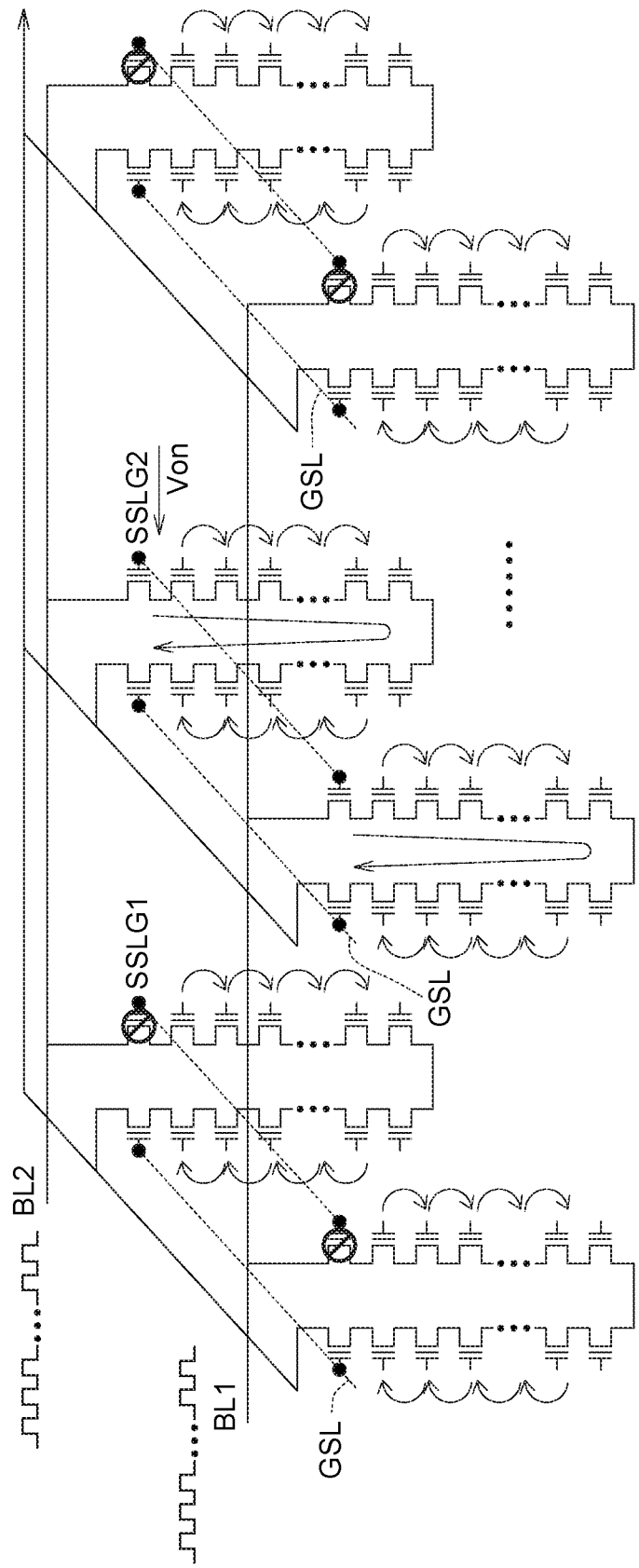

Please refer to FIGS. 5 to 7, which illustrate the word line pioneering scheme. At first, as shown in FIG. 5, read voltage Vread is applied to the word line WL1, pass voltage Vpass is applied to the other word lines, turn-on voltage Von is applied to the string selecting line group SSLG1, and the patterns are inputted to the bit lines BL1, BL2, . . . .

Next, as shown in FIG. 6, the read voltage Vread is applied to the word line WL2, the pass voltage Vpass is applied to the other word lines, the turn-on voltage Von is still applied to the string selecting line group SSLG1, and the patterns are inputted to the bit lines BL1 BL2, . . . . Then, the read voltage Vread is switched to be applied to the next word line until the read voltage Vread has been applied to the last word line. That is to say, the word line switching loop is performed once.

Afterwards, as shown in FIG. 7, the turn-on voltage Von is switched to be applied to the string selecting line group SSLG2 and the word line switching loop is performed again. The sequence of the word line switching loop in FIG. 7 and that in FIG. 6 are reverse.

Figure 8:
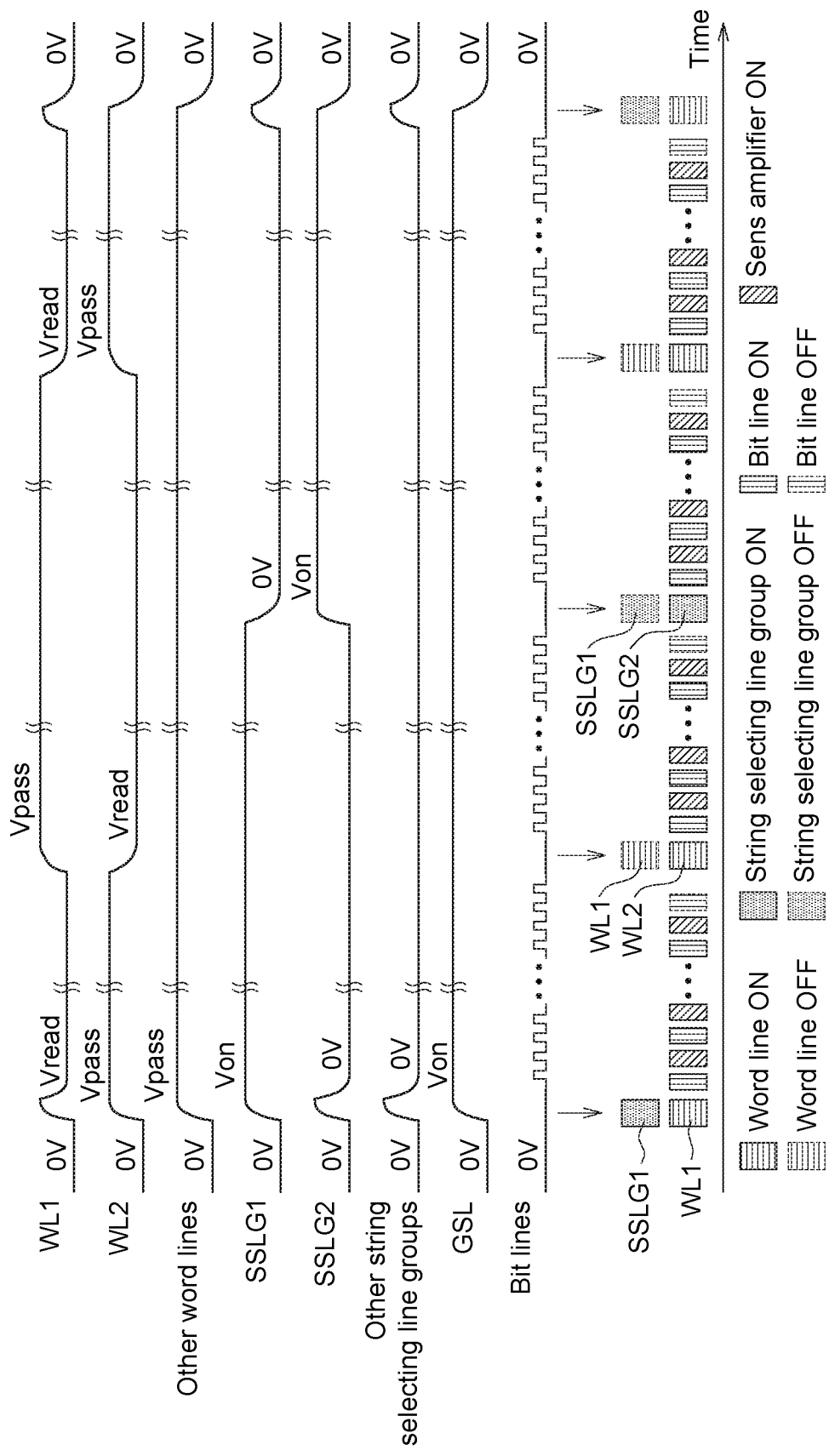
FIG. 8 illustrates the wave form in the word line pioneering scheme.

Please refer to FIG. 8, which illustrates the wave form in the word line pioneering scheme. At first, the word line WL1 is pre-charged to the read voltage Vread, the string selecting line group SSLG1 is pre-charged to the turn-on voltage Von, and the patterns are inputted to the bit lines BL1, BL2, . . . .

Then, the next filter for the inference operation can be the next word line WL2 in the same string selecting line group SSLG1, so the word line WL1 is dis-charged to the pass voltage Vpass and the word line WL2 is pre-charged to the read voltage Vread.

Next, after the word line switching loop is performed once, the next filter for the inference operation is in the next string selecting line group SSLG2, so the string selecting line group SSLG1 is dis-charged to 0V and the string selecting line group SSLG2 is pre-charged to the turn-on voltage Von. At this time, one of the string selecting line groups, such as the string selecting line group SSLG1, is switched, but any one of the word lines WL1, WL2, . . . is not switched.

Base on above, when the patterns inputted to each of the bit lines BL1, BL2, . . . are switched, any of the word lines WL1, WL2, . . . is not switched and any one of the string selecting line groups SSLG1, SSLG2, . . . is not switched. In detail, one of the word lines, such as the word line WL1, is pre-charged before switching the patterns, and dis-charged after switching the patterns. Moreover, when the patterns are switched, voltages of the word lines WL1, WL2, . . . are held and voltages of the string selecting lines SSL1, SSL2, . . . are held. That is to say, the proposed embodiment exploits the feasibility of sharing pre-charged word line string selecting line group/ground selecting line while switching the patterns. The pre-charged word line/string selecting line group/ground selecting line is unchanged while filters are striding with different inputs.

In the word line pioneering scheme, the word lines WL1, WL2, . . . are switched before any one of the string selecting line groups is switched. Moreover, when the word lines WL1, WL2, . . . are switched, voltages of the string selecting lines SSL1, SSL2, . . . are held.

In detail, one of the string selecting line groups, such as the string selecting line group SSLG1, is pre-charged before switching the word lines WL1, WL2, . . . , and dis-charged after switching the word lines WL1, WL2, . . . .

Figure 9:
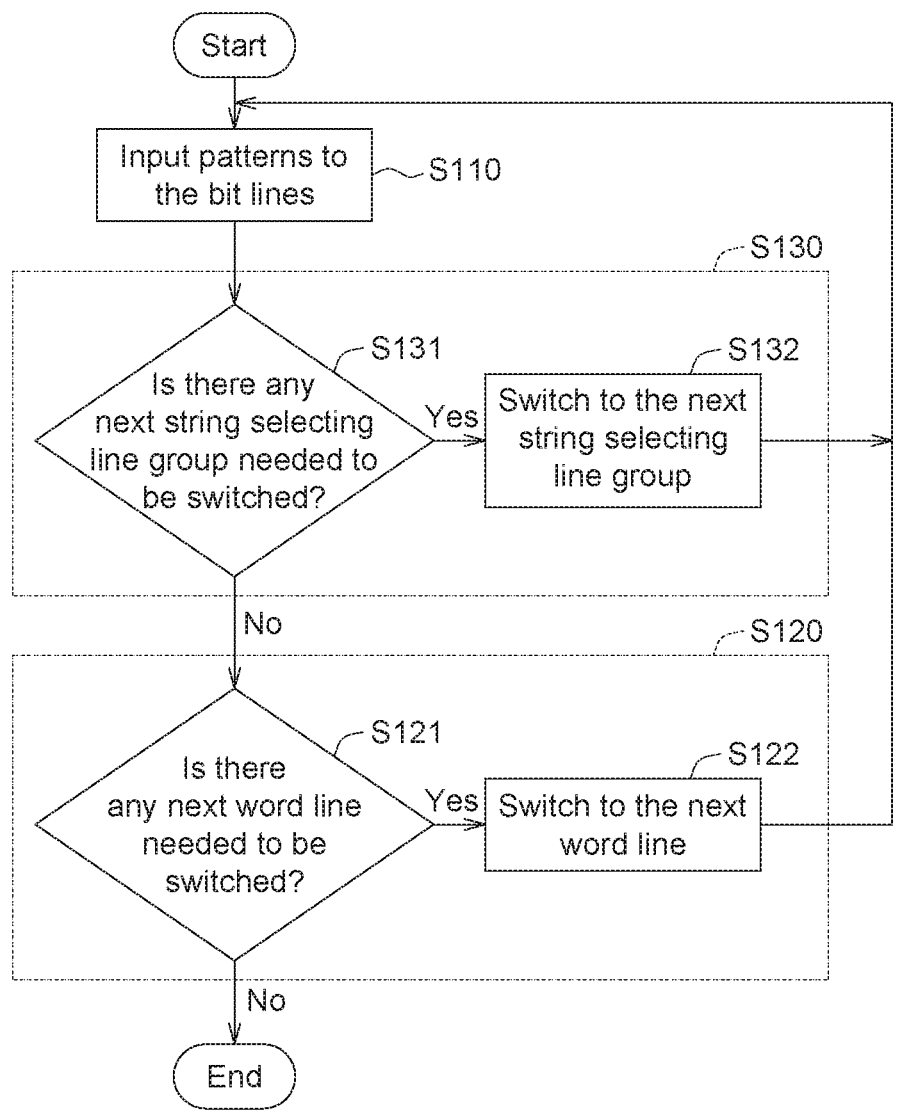
FIG. 9 shows a flowchart of the inference operation method of the 3D NAND artificial intelligence accelerator according to the string selecting line group pioneering scheme.

Please refer to FIG. 9, which shows a flowchart of the inference operation method of the 3D NAND artificial intelligence accelerator 100 according to the string selecting line group pioneering scheme. In step S110, the patterns are inputted to the bit lines BL1, BL2, . . . .

In step S130, the string selecting line groups SSLG1, SSLG2, . . . are switched to switch the filters. The step S130 includes steps S131 and S132. In step S131, whether there is any next string selecting line group needed to be switched is determined. If there is another string selecting line group needed to be switched, then the process proceeds to step S132. In step S132, the next string selecting line group is switched. Then, the step S110 is performed again for this string selecting line group.

In step S120, the word lines WL1, WL2, . . . are switched to switch the filters. The step S120 includes steps S121 and S122. In step S121, whether there is any next word line needed to be switched is determined. If there is another word line needed to be switched, then the process proceeds to step S122. In step S122, the next word line is switched. Then, the step S110 is performed again for this word line.

That is to say, in the string selecting line group pioneering scheme, each time one of the string selecting line groups is switched, the patterns inputting loop is performed; and each time one of the word lines is switched, the string selecting line group switching loop is performed.

Figure 10:
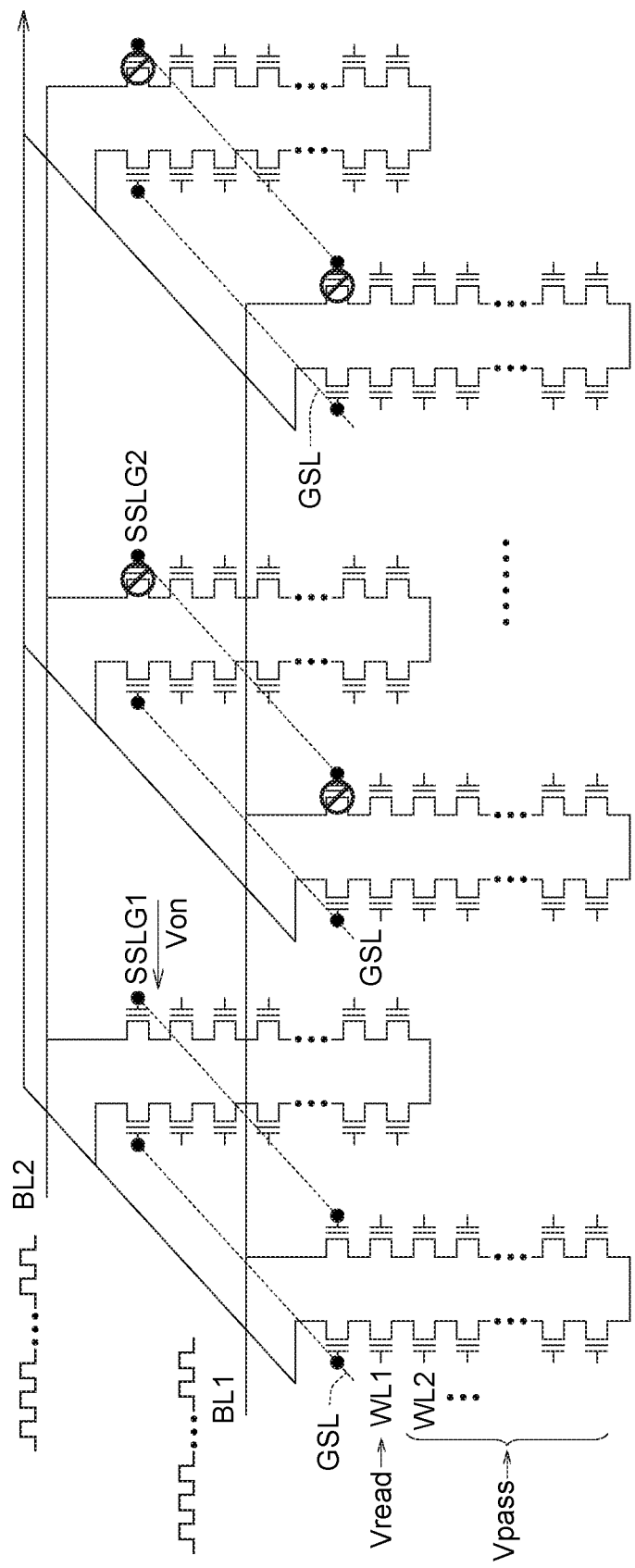
FIGS. 10 to 13 illustrate the string selecting line group pioneering scheme.

Please refer to FIGS. 10 to 13, which illustrate the string selecting line group pioneering scheme. At first, as shown in FIG. 10, the read voltage Vread is applied to the word line WL1, the pass voltage Vpass is applied to the other word lines, the turn-on voltage Von is applied to the string selecting line group SSLG1, and the patterns are inputted to the bit lines BL1, BL2, . . . .

Figure 11:
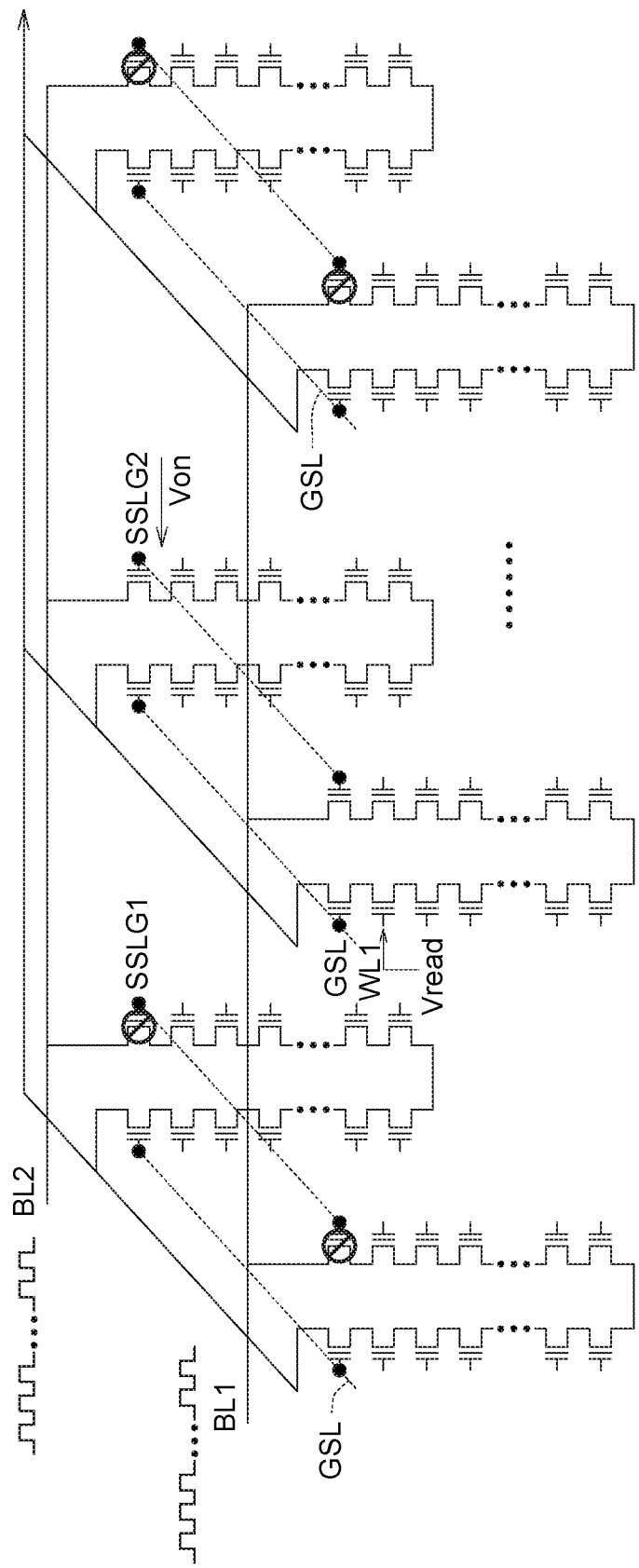

Next, as shown in FIG. 11, the read voltage Vread is still applied to the word line WL1, the pass voltage Vpass is still applied to the other word lines, the turn-on voltage Von is applied to the string selecting line group SSLG2, and the patterns are inputted to the bit lines BL1, BL2, . . . .

Figure 12:
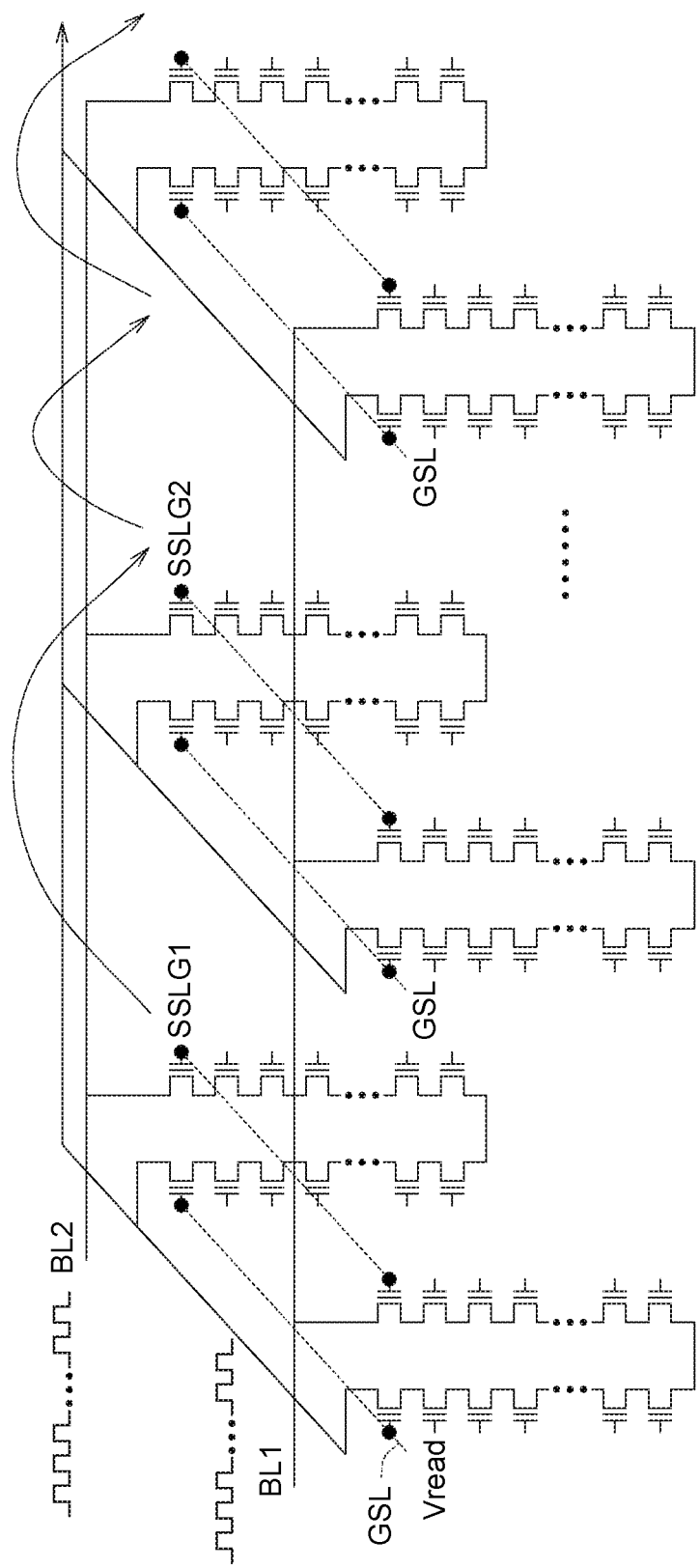

Afterwards, as shown in FIG. 12, the turn-on voltage Von is switched to be applied to the next string selecting line group until the turn-on voltage Von has been applied to the last string selecting line group. That is to say, the string selecting line group switching loop is performed once.

Figure 13:
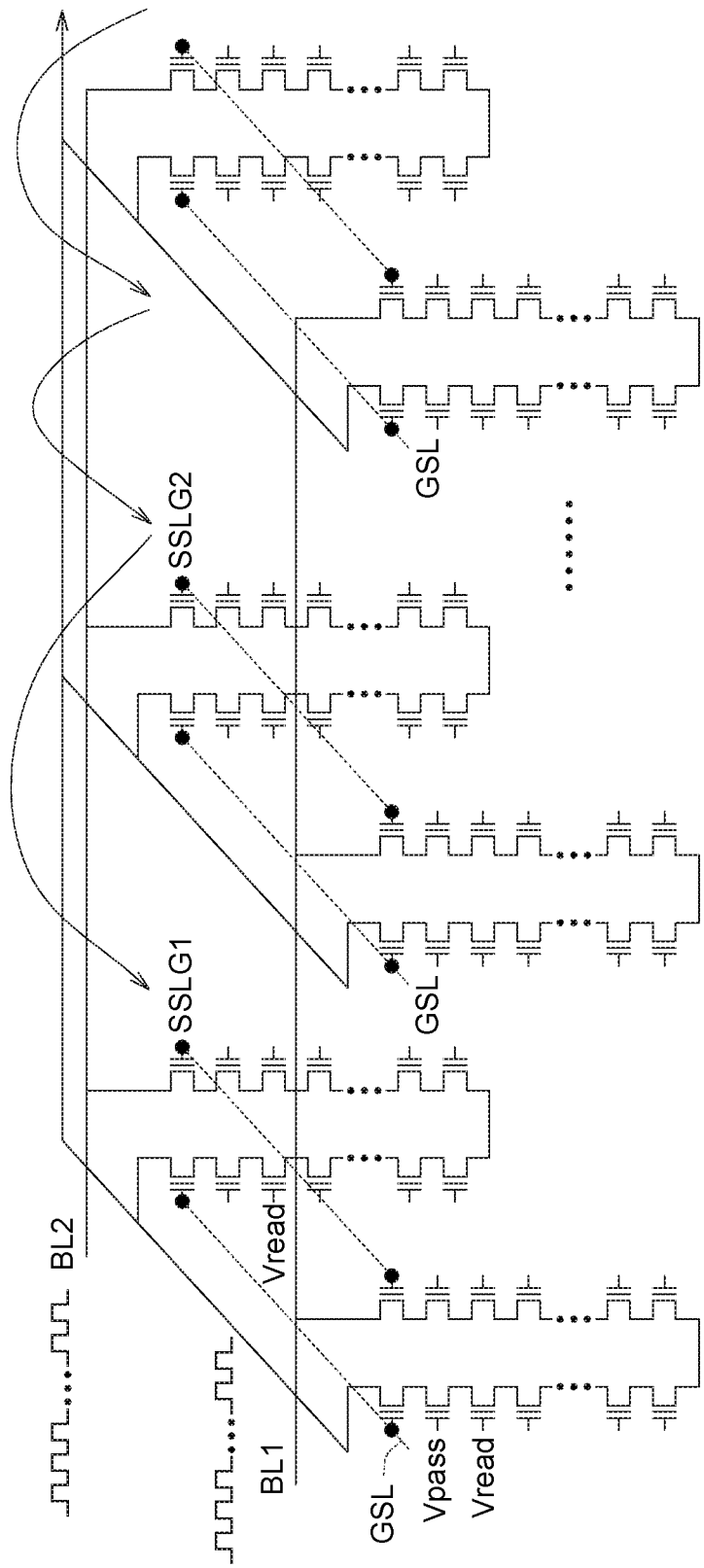

As shown in FIG. 13, at the next string selecting line group switching loop, the string selecting line group switch sequence is reversed.

Figure 14:
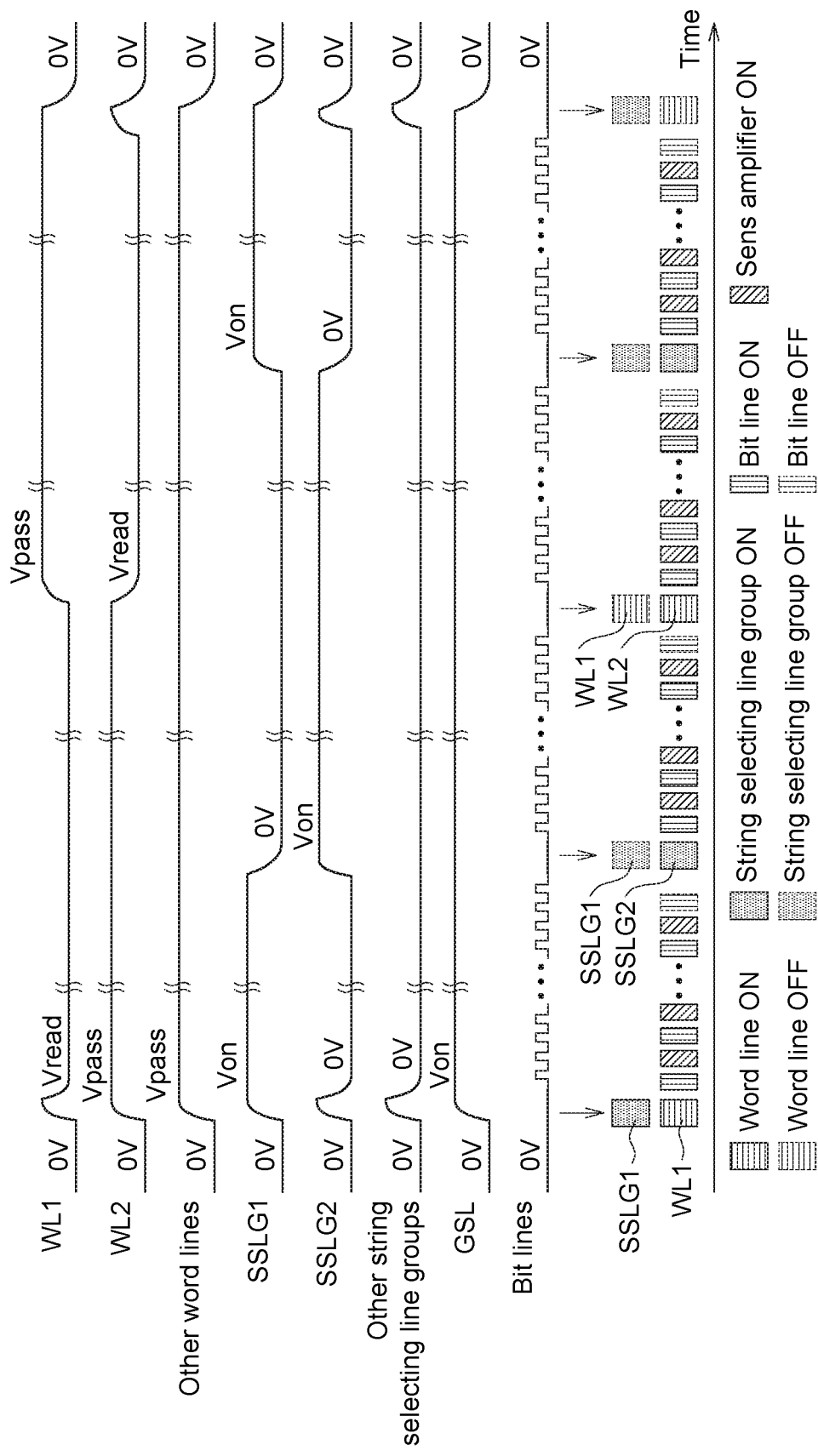
FIG. 14 illustrates the wave form in the string selecting line group pioneering scheme.

Please refer to FIG. 14, which illustrates the wave form in the string selecting line group pioneering scheme. At first, the word line WL1 is pre-charged to the read voltage Vread, the selecting line group SSLG1 is pre-charged to the turn-on voltage Von, and the patterns are inputted to the bit lines BL1, BL2, . . . .

Then, the next filter for the inference operation can be the next string selecting line group SSLG2 corresponding the same word line WL1, so the string selecting line group SSLG1 is dis-charged to 0V and the string selecting line group SSLG2 is pre-charged to the turn-on voltage Von.

Next, after the string selecting line group switching loop is performed once, the next filter for the inference operation corresponds the next word line WL2, so the word line WL1 is dis-charged to the pass voltage Vpass and the word line WL2 is pre-charged to the read voltage Vread. At this time, one of the word lines, such as the word line WL1, is switched, but any one of the string selecting line groups SSLG1, SSLG2, . . . is not switched.

Base on above, when the patterns inputted to each of the bit lines BL1, BL2, . . . are switched, any one of the word lines WL1, WL2, . . . is not switched and any one of the string selecting line groups SSLG1, SSLG2, . . . is not switched. In detail, one of the string selecting line groups, such as the string selecting line group SSLG1, is pre-charged before switching the patterns, and dis-charged after switching the patterns. Moreover, when the patterns are switched, voltages of the word lines WL1, WL2, . . . are held and voltages of the string selecting lines SSL1, SSL2, . . . are held. That is to say, the proposed embodiment exploits the feasibility of sharing pre-charged word line/string selecting line group/ground selecting line while switching the patterns. The pre-charged word line/string selecting line group/ground selecting line is unchanged while filters are striding with different inputs.

In the string selecting line group pioneering scheme, the string selecting line groups SSLG1, SSLG2, . . . are switched before any one of the word lines is switched. Moreover, when the string selecting line groups SSLG1, SSLG2, . . . are switched, voltages of the word lines WL1, WL2, . . . are held.

In detail, one of the word lines, such as the word line WL1, is pre-charged before switching the string selecting line group SSLG1, SSLG2, . . . , and dis-charged after switching the string selecting line group SSLG1, SSLG2, . . . .

Figure 15:
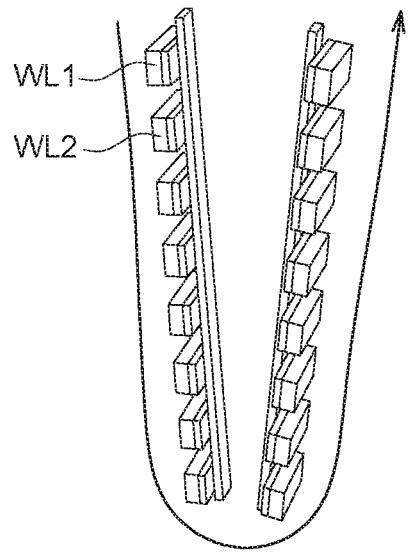
FIGS. 15 to 17 show several ways to perform the word line switching loop.
Figure 16:
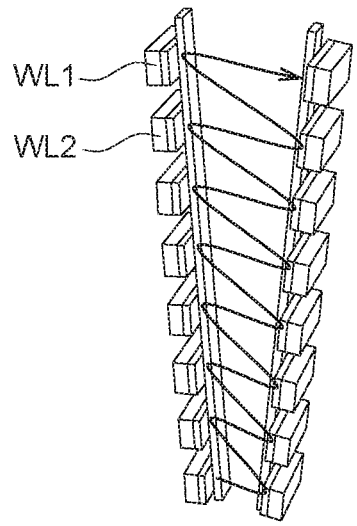
Figure 17:
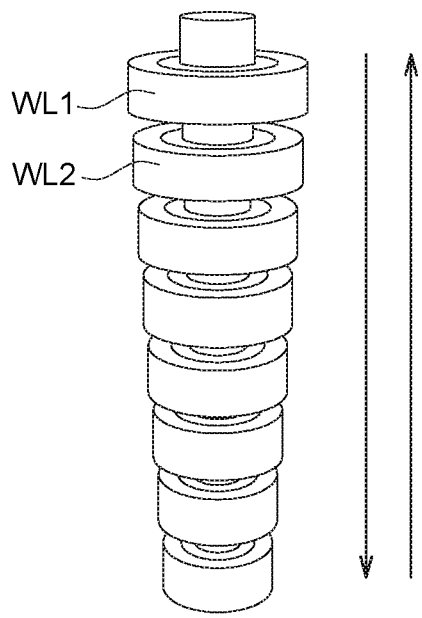

Further, the word line switching loop may be performed by different ways according to different structures. Please refer to FIGS. 15 to 17, which show several ways to perform the word line switching loop. As shown in FIG. 15, the word line switching loop may be performed along a U-turn sequence. As shown in FIG. 16, the word line switching loop may be performed along a shoelace sequence. As shown in FIG. 17, the word line switching loop may be performed along a roundtrip sequence.

According to the embodiments, the inference operation of the 3D NAND artificial intelligence accelerator is performed by sharing the pre-charged word line/string selecting line group/ground selecting line. The time and energy consumption can thus be amortized.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An inference operation method of a 3D NAND artificial intelligence accelerator, wherein the 3D NAND artificial intelligence accelerator includes a plurality of memory cells, a plurality of bit lines, a plurality of word lines and a plurality of string selecting line groups each of which includes at least one string selecting line, a plurality of filter data bits are stored in the memory cells that are selected by the word lines, the string selecting lines and the bit lines when being read, a plurality of patterns are inputted to the bit lines for performing a Multiply-Accumulation (MAC) operation, and the inference operation method comprises:
    inputting the patterns to the bit lines;
    switching the word lines to switch the filter data bits; and
    switching the string selecting line groups to switch the filter data bits;
    wherein in a word line pioneering scheme and a string selecting line group pioneering scheme, when the patterns inputted to each of the bit lines are switched, any one of the word lines is not switched and any one of the string selecting line groups is not switched;
    wherein in the word line pioneering scheme and the string selecting line group pioneering scheme, when the patterns are switched, voltages of the word lines are held;

and when the patterns are switched, voltages of the string selecting lines are held.

2. The inference operation method according to claim 1, wherein in the word line pioneering scheme and the string selecting line group pioneering scheme, one of the word lines is pre-charged before switching the patterns, and dis-charged after switching the patterns.

3. The inference operation method according to claim 1, wherein in the word line pioneering scheme, the word lines are switched before any one of the string selecting line groups is switched; and when the word lines are switched, voltages of the string selecting lines are held.

4. The inference operation method according to claim 1, wherein in the word line pioneering scheme, one of the string selecting line groups is pre-charged before switching the word lines, and dis-charged after switching the word lines; and when one of the string selecting line groups is switched, any one of the word lines is not switched.

5. The inference operation method according to claim 1, wherein in the string selecting line group pioneering scheme, one of the string selecting line groups is pre-charged before switching the patterns, and dis-charged after switching the patterns.

6. The inference operation method according to claim 1, wherein in the string selecting line group pioneering scheme, the string selecting line groups are switched before any one of the word lines is switched.

7. The inference operation method according to claim 1, wherein in the string selecting line group pioneering scheme, when the string selecting line groups are switched, voltages of the word lines are held.

8. The inference operation method according to claim 1, wherein in the string selecting line group pioneering scheme, one of the word lines is pre-charged before switching the string selecting line groups, and dis-charged after switching the string selecting line groups.

9. The inference operation method according to claim 1, wherein in the string selecting line group pioneering scheme, when one of the word lines is switched, any one of the string selecting line groups is not switched.

10. A controlling circuit of a 3D NAND artificial intelligence accelerator, wherein the 3D NAND artificial intelligence accelerator includes a plurality of memory cells, a plurality of bit lines, a plurality of word lines and a plurality of string selecting line groups each of which includes at least one string selecting line, a plurality of filter data bits are stored in the memory cells that are selected by the word lines, the string selecting lines and the bit lines when being read, a plurality of patterns are inputted to the bit lines for performing a Multiply-Accumulation (MAC) operation, and the controlling circuit comprising:
    a bit line controller, configured to input the patterns to the bit lines; and
    a word line and string selecting line controller, configured to switch the word lines to switch the filter data bits, and configured to switch the string selecting line groups to switch the filter data bits;
    wherein in a word line pioneering scheme and a string selecting line group pioneering scheme, when the bit line controller switches the patterns inputted to each of the bit lines, any one of the word lines is not switched and any one of the string selecting line groups is not switched;
    wherein in the word line pioneering scheme and the string selecting line group pioneering scheme, when the patterns are switched, voltages of the word lines are held; and when the patterns are switched, voltages of the string selecting lines are held.

11. The controlling circuit according to claim 10, wherein in the word line pioneering scheme and the string selecting line group pioneering scheme, one of the word lines is pre-charged before switching the patterns, and dis-charged after switching the patterns.

12. The controlling circuit according to claim 10, wherein in the word line pioneering scheme, the word lines are switched before any one of the string selecting line groups is switched; and when the word lines are switched, voltages of the string selecting lines are held.

13. The controlling circuit according to claim 10, wherein in the word line pioneering scheme, one of the string selecting line groups is pre-charged before switching the word lines, and dis-charged after switching the word lines; and when one of the string selecting line groups is switched, any one of the word lines is not switched.

14. The controlling circuit according to claim 10, wherein in the string selecting line group pioneering scheme, one of the string selecting line groups is pre-charged before switching the patterns, and dis-charged after switching the patterns.

15. The controlling circuit according to claim 10, wherein in the string selecting line group pioneering scheme, the string selecting line groups are switched before any one of the word lines is switched.

16. The controlling circuit according to claim 10, wherein in the string selecting line group pioneering scheme, when the string selecting line groups are switched, voltages of the word lines are held.

17. The controlling circuit according to claim 10, wherein in the string selecting line group pioneering scheme, one of the word lines is pre-charged before switching the string selecting line groups, and dis-charged after switching the string selecting line groups.

18. The controlling circuit according to claim 10, wherein in the string selecting line group pioneering scheme, when one of the word lines is switched, any one of the string selecting line groups is not switched.

* * * * *